United States Patent [19]
Kaneda et al.

[11] Patent Number: 5,212,710
[45] Date of Patent: May 18, 1993

[54] LASER LIGHT BEAM SYNTHESIZING APPARATUS

[75] Inventors: Yushi Kaneda; Michio Oka, both of Kanagawa, Japan

[73] Assignee: Sony Corporation, Tokyo, Japan

[21] Appl. No.: 728,583

[22] Filed: Jul. 11, 1991

[30] Foreign Application Priority Data

Jul. 19, 1990 [JP] Japan .................. 2-191152

[51] Int. Cl.$^5$ .......................... G02B 6/26; G02B 6/28; H01S 3/133; H01S 3/14
[52] U.S. Cl. ...................................... 372/71; 372/75; 359/483; 385/11; 385/24
[58] Field of Search ................... 372/69, 70, 71, 75, 372/109; 359/483–485, 487; 385/11, 24

[56] References Cited

U.S. PATENT DOCUMENTS

| | | | |
|---|---|---|---|
| 4,300,812 | 11/1981 | Nakahashi | 350/42 |
| 4,720,162 | 1/1988 | Mochizuki et al. | 385/11 X |
| 4,763,975 | 8/1988 | Scifres et al. | 350/96.15 |
| 4,784,450 | 11/1988 | Jain et al. | 385/11 X |
| 4,805,977 | 2/1989 | Tamura et al. | 385/11 X |
| 5,025,449 | 6/1991 | Yamamoto et al. | 372/32 |
| 5,048,030 | 9/1991 | Hiiro | 372/68 |

FOREIGN PATENT DOCUMENTS

WO91/12641 8/1991 PCT Int'l Appl. .
2182168A 5/1987 United Kingdom .

OTHER PUBLICATIONS

Applied Optics, vol. 28, No. 21, Nov. 1, 1989, New York, USA, pp. 4560–4568; K. Tatsuno et al.: "Diffraction-Limited Circular Single Spot from Phased Array Lasers."

Optics Communications, vol. 82, No. 3/4. Apr. 15, 1991, Amsterdam, NL, pp. 299–304; G. P. A. Malcolm et al.: "Ti: Sapphire Laser Pumped by a Frequency Doubled Diode Pumped Nd: YLF Laser."

Primary Examiner—Akm E. Ullah
Attorney, Agent, or Firm—Philip M. Shaw, Jr.

[57] ABSTRACT

A laser light source in which a couple of light beams whose shapes are re-formed and whose polarizing planes are made perpendicular to each other are synthesized by a beam splitter and then the synthesized light is incident on an optical guide through a predetermined optical system, thereby generating the synthesized light having a short spot diameter and an improved power density.

31 Claims, 6 Drawing Sheets

LASER LIGHT BEAM SYNTHESIZING APPARATUS

BACKGROUND OF THE INVENTION

1. Field of the Invention

The present invention generally relates to laser generating apparatus, and more particularly, is directed to an end pumped solid-state laser and pumping source thereof.

2. Description of the Prior Art

Conventionally, a laser light source is employed in order to efficiently pump or excite a solid-state laser.

More specifically, in a prior-art side pumping method where a laser light source pumps from a side face of a solid state laser rod such as Nd:YAG as shown in FIG. 1, a light resonator is composed of respective side faces of, for example, a cylindrical laser medium or laser rod 1. From the laser light source, a pumping or exciting light L1 is incident in the direction perpendicular to an axis O of the light resonator, that is, onto the side face of the laser rod 1.

The above-mentioned structure provides a wider area which is irradiated with the pumping light L1, whereby the whole light quantity of the pumping light L1 incident to the laser rod 1 can be correspondingly augmented, so that a laser light L0 having a large light intensity as a whole can be emitted from the laser rod 1. However, with the side pumping method is difficult to obtain a laser light L0 having a spot of short diameter.

For this reason, an end pumping method is employed for obtaining a laser light of a short spot diameter, where a pumping light L2 is incident to a laser rod 3 from the end face thereof to pump the same, as shown in FIG. 2. More specifically, mirrors 4, 5 are disposed in the vicinity of respective end faces of the laser rod 3, whereby a light resonator is formed as a whole for a laser light L0 emitted from the laser rod 3.

Further, the mirror 4 selectively transmits the pumping light L2, while the mirror 5 transmits a part of the laser light L0 and reflects the rest of the same, whereby the pumping light L2 is incident on one end face of the laser rod 3 through the mirror 4 to pump or excite the laser rod 3. The laser light L0 resonated by the light resonator composed of the mirrors 4, 5 is emitted through the mirror 5.

With the above structure, a region of the laser rod 3 on which the pumping light L2 is incident is pumped, whereby a laser light is induced and then emitted from this pumped region. It is therefore possible to generate a laser light L0 of a short spot diameter by reducing the beam diameter of the pumping light L2. Thus, a light beam emitted, for example, from a laser diode is incident to an end face of a laser rod as a pumping light to thereby generate a desired laser light LO from the laser rod.

For generating a laser light L0 with a short beam diameter and a large light quantity by pumping a laser rod with a pumping light by the end pumping method, it is necessary to pump the laser rod 3 with a pumping light L2 having a short beam diameter and a large light quantity, that is, a pumping light L2 having a large power density.

However, the laser diode can merely generate a light beam having approximately 1 W at present, and therefore it is a future problem how to enhance the intensity of the pumping light.

Though the end pumping method can generate the laser light L0 of a short spot diameter, it cannot efficiently pump a laser rod, thereby presenting a difficulty in enhancing the intensity of the laser light L0.

There has been proposed as one solution for this problem a method of generating a pumping light having a large light quantity by using an optical fiber bundle 7 as illustrated in FIG. 3 (OPTICS LETTERS/Vol. 13, No. 4/April 1988, pp 306–308, Fiber-bundle coupled, end pumped Nd:YAG laser).

More specifically, light beams emitted from laser diodes 8A–8N are led to respective optical fibers constituting the fiber optics bundle 7 to thereby guide and converge the light beams from the laser diodes 8A–8N by means of the fiber optics bundle 7. Then, a pumping light L3, which is appropriately converged for pumping a laser rod 12, is generated through lenses 9 and 10. The laser rod 12 is formed with a mirror surface on one end face thereof on the side of the fiber optics bundle 7 for selectively transmitting the pumping light L3, thereby forming an optical resonator by the end face having the mirror surface and a mirror 5.

Since the light beams emitted from the laser diodes 8A–8N are converged by the fiber optics bundle 7, the light quantity of the pumping light L3 is enhanced. Thus, if the light beams from a plurality of the high-output laser diodes are converged by the fiber optics bundle 7 to generate the pumping light L3, a laser light having a short spot diameter and a high light intensity can be emitted.

On the other hand, a high-output laser diode is configured to have a large stripe width which may be, for example, 100 μm. For delivering a light beam outputted from such a laser diode to an optical fiber, it is necessary to employ an optical fiber having a diameter larger than the stripe width of the high-output laser diode, which is required by an optical coupling. As the result, the whole diameter of the fiber optics bundle 7 becomes large, which leads to increase in the beam diameter of the pumping light L3 outputted from the fiber optics bundle 7. Thus, the pumping light L3 having a large light intensity is provided, whereas the spot diameter of the pumping light L3 is larger, thereby presenting a difficulty in improving the power density.

Although a laser light having a large light intensity can be generated by applying the pumping light L3 to the end pumping method, the spot diameter of the laser light pumped by the pumping light L3 becomes larger corresponding to the spot diameter thereof.

OBJECTS AND SUMMARY OF THE PRESENT INVENTION

It is a first object of the present invention to provide a laser light source exhibiting a high power density.

It is another object of the present invention to provide a laser light source having a short spot diameter.

It is a further object of the present invention to provide a solid-state laser exhibiting a high power density by using the above-mentioned laser light source.

It is an additional object of the present invention to provide a solid-state laser having a short spot diameter by using the above-mentioned laser light source.

The present invention is directed to an end-pumped solid-state laser and a laser light source for its pumping, wherein a couple of optical beams having respective beam shapes are re-formed and polarizing planes arranged perpendicular to each other are synthesized by a polarizing beam splitter and thereafter led to an optical guide such as an optical fiber through a predetermined optical system, thereby generating a synthesized light having a short spot diameter and an improved power density and providing an end-pumped solid-state laser by pumping a laser by this synthesized light.

More specifically, to solve the problems mentioned above, the present invention provides a laser light source comprising first and second light sources for emitting first and second light beams respectively having a predetermined polarizing plane and the cross-sectional shape of a flattened ellipse, first beam shape re-form means for re-forming the beam shape of the first light beam to have a more circular cross-section, second beam shape re-form means for re-forming the beam shape of the second light beam, and a polarizing beam splitter coupled to receive a first light beam outputted from the first beam shape re-form means and a second beam outputted from the second beam shape re-forming means which has the polarizing plane inclined by 90 degrees relative to the first beam. A synthesized light outputted from the polarizing beam splitter is supplied to an optical guide such as an optical fiber to pump a laser rod to thereby generate a laser light. Incidentally, the synthesized light outputted from the polarizing beam splitter may be supplied to an optical fiber through an optical system for converging a light.

The present invention constructed as described above re-forms the beam shapes of light beams to have a cross-sectional shape which more approximates the cross-sectional shape of an optical fiber and supplies the re-formed light beams to an optical guide such as an optical fiber, whereby an optical guide of a short spot diameter can be employed.

The first and second light beams are synthesized by the polarizing beam splitter in a state where the polarizing planes thereof are different by 90 degrees with each other and led to the optical fiber, thereby generating a laser light of a short spot diameter as well as a synthesized light with an improved power density.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

The present invention will now be described in detail with reference to the accompanying drawings.

Figure 1:
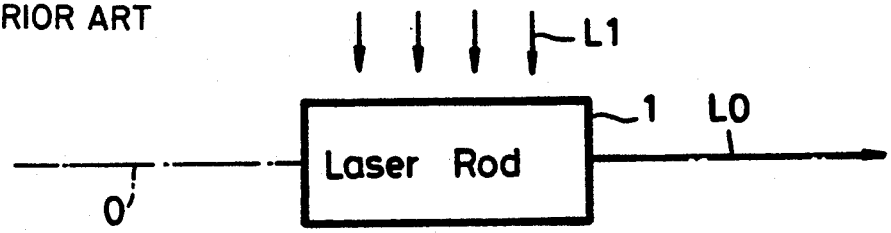
FIG. 1 is a schematic diagram illustrating a known side pumping method.
Figure 2:
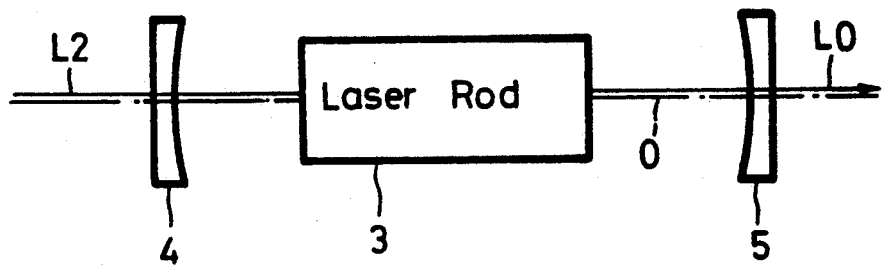
FIG. 2 is a schematic diagram illustrating a known end pumping method.
Figure 3:
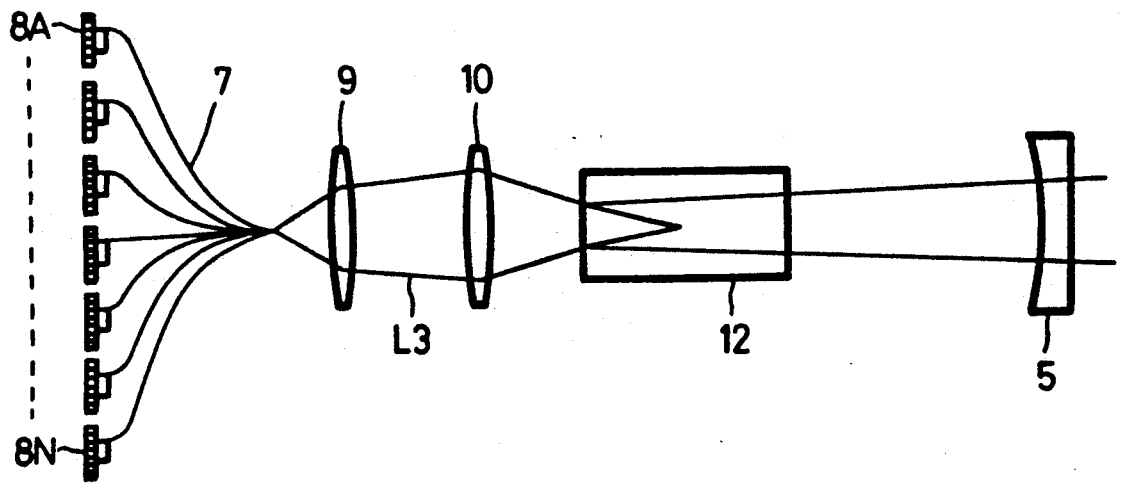
FIG. 3 is a schematic diagram of a known arrangement showing how a laser light is pumped by using a fiber optics bundle.
Figure 4:
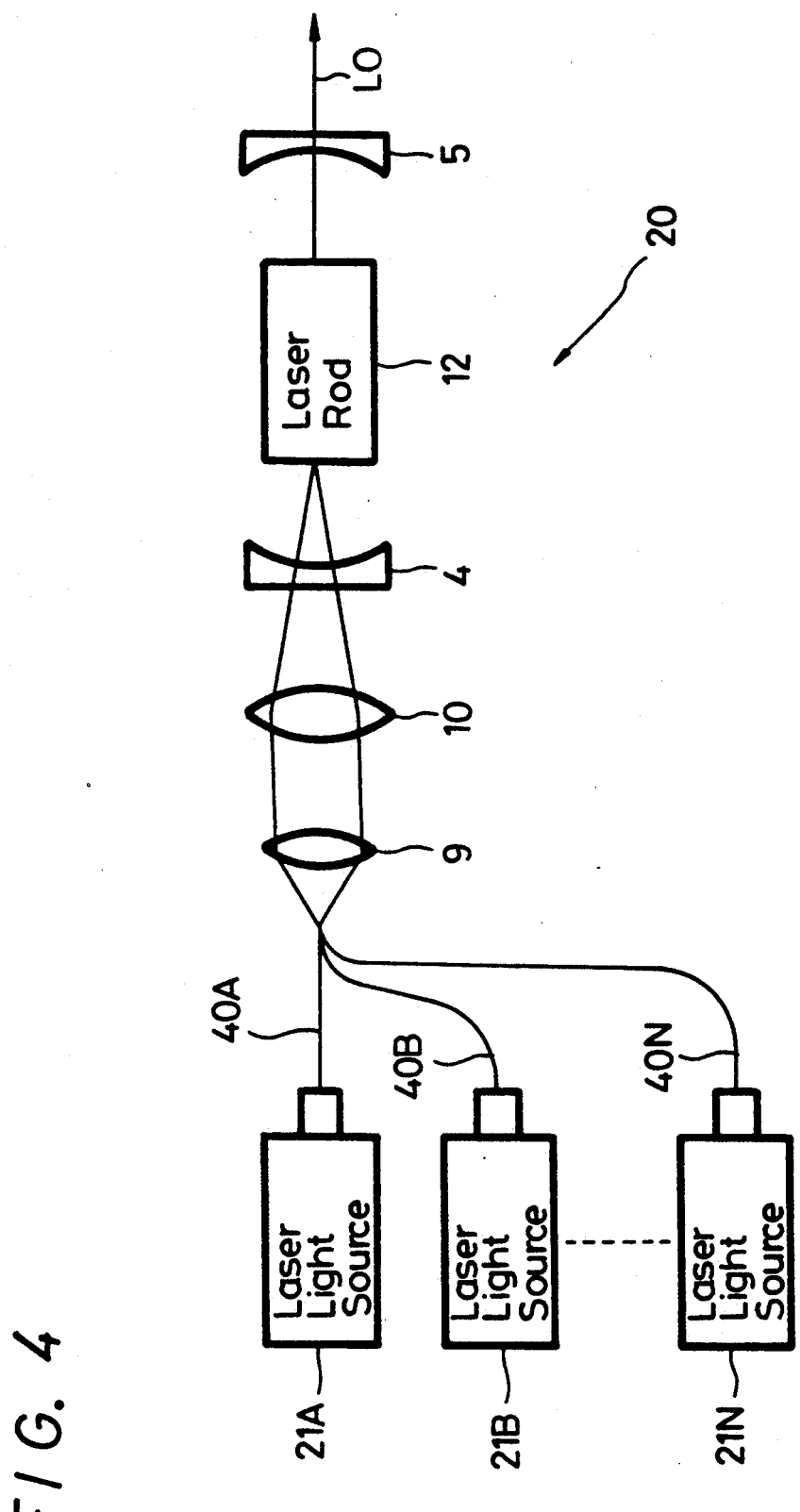
FIG. 4 is a block diagram illustrating a laser apparatus in which the present invention is implemented.

FIG. 4 illustrates a laser apparatus 20 in which the present invention is implemented, where like parts corresponding to those of FIG. 3 are marked with the same reference numerals and therefore need not be described. In brief, in this embodiment, laser lights emitted from laser light sources 21A-21N are converged through optical fibers 40A-40N to generate a pumping or exciting light.

Figure 5:
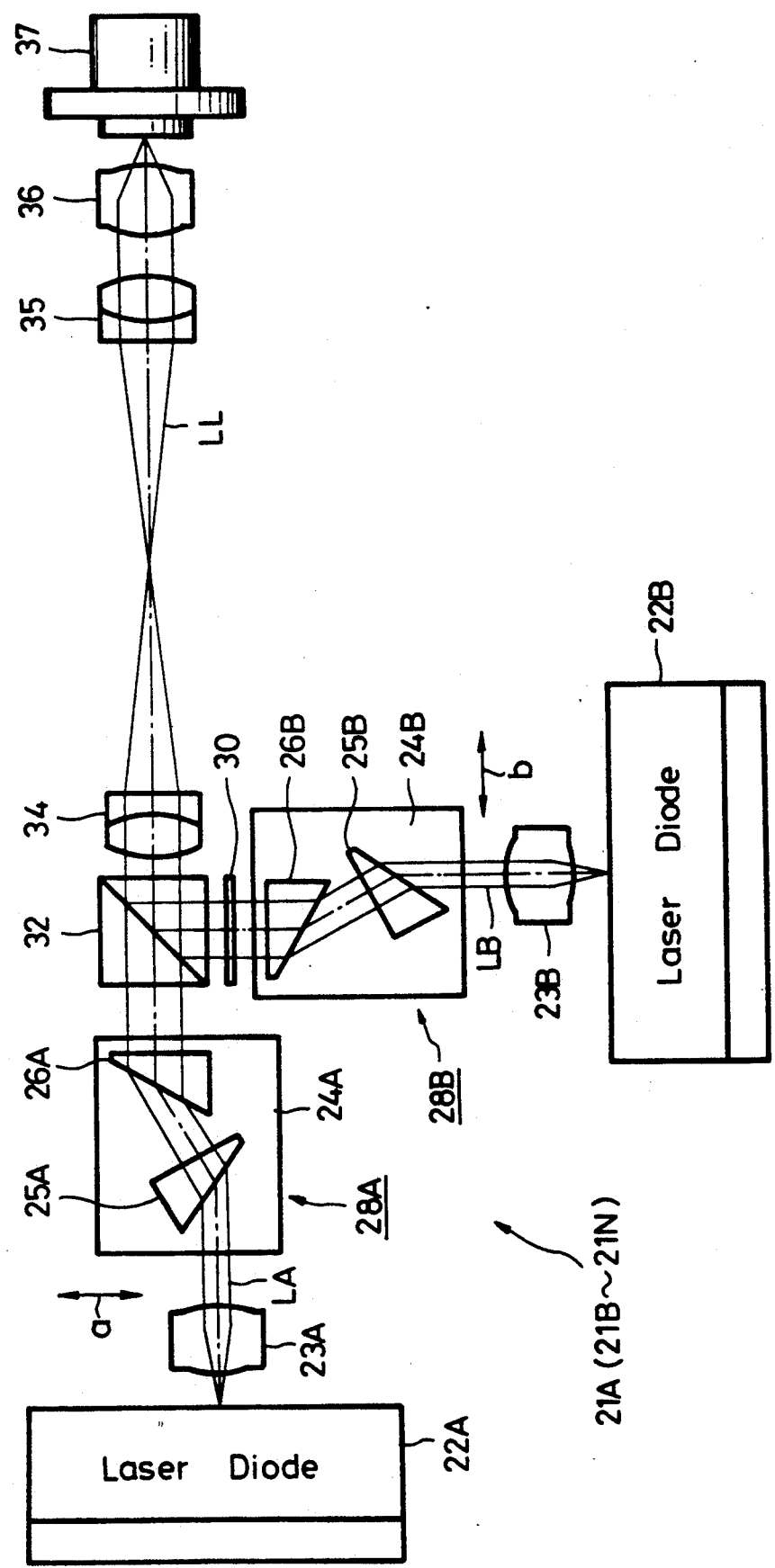
FIG. 5 is a block diagram illustrating a first embodiment of a laser source according to the present invention.

FIG. 5 illustrates a part of the laser light source employed in a first embodiment of the present invention. As shown in FIG. 5, each of the laser light sources 21A-21N shown in FIG. 4 has a pair of laser diodes 22A and 22B for emitting light beams LA and LB having an intensity of, for example, 1 W. In this embodiment, the laser diodes 22A and 22B are disposed such that the directions of the stripes for emitting lights are both oriented in parallel with the surface of the sheet of drawing and the optical axes of the optical beams LA and LB are perpendicular to each other. Thus, the light beams LA and LB emitted from the laser diodes 22A and 22B are such that the polarizing planes thereof are in parallel to the surface of the sheet of drawing as indicated by arrows a and b and the beam shape thereof is an ellipsoid where the respective beams extend over an angle of, for example, approximately 10 degrees in the direction parallel to the surface of the sheet of drawing and over 30 degrees in the direction vertical to the same.

On the optical axes of the respective laser diodes 22A and 22B, there are disposed collimator lenses 23A and 23B, respectively, to convert the light beams LA and LB to parallel light beams. Further, on the optical axes of the collimator lenses 23A and 23B, there are disposed anamorphic prisms 28A and 28B respectively composed of two prisms 25A, 25B and 26A, 26B mounted on glass substrates 24A, 24B. These anamorphic prisms 28A and 28B re-form each of the shapes of the light beams LA and LB from a flat ellipse to an ellipse close to a circle. Incidentally, when the magnifications of the anamorphic prisms 28A and 28B were selected to be approximately 2.5, the beam shapes of the light beams LA and LB were changed from the flat ellipse to the ellipse close to a circle.

On the optical axis of the anamorphic prism 28B there is disposed a half-wave plate 30 with the a polarizing plane thereof being inclined by 45 degrees relative to the light beam LB, whereby the polarizing plane of the light beam LB is offset by 90 degrees from the polarizing plane of the light beam LA.

Thus, generated are the light beam LB having an elliptic beam shape close to a circle and a polarizing plane oriented vertical to the surface of the sheet of drawing and the laser beam LA having an elliptic beam shape close to a circle in a manner similar to the light beam LB and a polarizing plane and an optical axis perpendicular to those of the light beam LB.

Further, at the intersection of the optical axes of the anamorphic prism 28A and the half-wave plate 30, there is disposed a polarizing beam splitter (PBS) 32 at a position where the optical axes of the light beams LA and LB cross so as to synthesize the light beams LA and LB.

The polarizing beam splitter 32 has the properties of transmitting a p-wave but reflecting an s-wave. It will be understood that the light beam LA is transmitted through the polarizing beam splitter 32 while the light beam LB, the optical axis of which is perpendicular to that of the light beam LA, is polarized by 90 degrees by the polarizing beam splitter 32, whereby a synthesized light LL is generated by coinciding the optical axes of the light beams LA and LB with each other.

The light LL thus synthesized by coinciding the optical axes of the light beams LA and LB and shaped in an ellipse close to a circle, exhibits a light intensity approximately double that of the light beam LA or LB and accordingly a higher power density compared with the light beams LA and LB.

In addition, since the two light beams LA and LB having their polarizing planes perpendicular to each other are synthesized by the polarizing beam splitter 32, the synthesized light LL can be generated while effectively avoiding the interference between the two light beams LA and LB.

Figure 6:
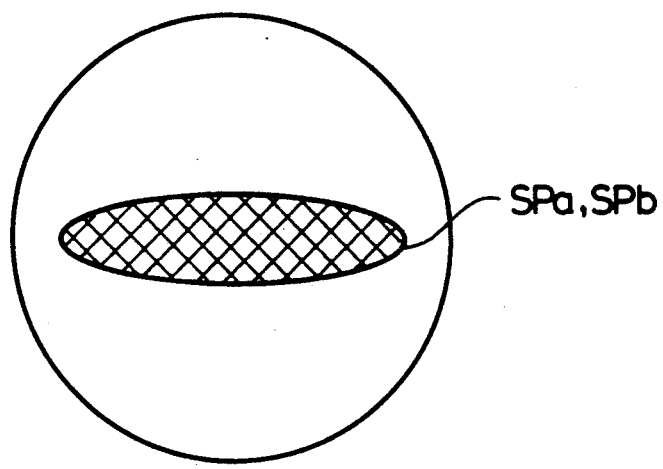
FIG. 6 is a schematic diagram illustrating a spot of a light beam emitted onto an end face of an optical fiber in the first embodiment of the present invention.

FIG. 6 illustrates a beam spot shape on an end surface of an optical fiber connected to an optical connector 37 shown in FIG. 5. The respective beam spots SPa and SPb of the light beams LA and LB, respectively, are formed in a substantially identical region on the end surface of the optical fiber.

For generating a synthesized light by two laser lights, the polarizing planes of which are perpendicular to each other, which are incident to the polarizing beam splitter 32, a method may be thought where two laser lights, the polarizing planes of which are perpendicular to each other, are generated at first and thereafter the beam shapes thereof are re-formed to be an ellipse close to a circle.

Nevertheless, the anamorphic prism generally has the characteristic of changing the transmittance in accordance with polarizing planes. Specifically, the anamorphic prisms 28A, 28B exhibit substantially 100% of transmittance for a polarizing plane parallel to the surface of the sheet of drawing while produce a loss of approximately 10% for a polarizing plane vertical to the surface of the drawing paper. For this reason, after the beam shape has been re-formed, the polarizing plane is polarized by 90 degrees through the half-wave plate 30 to thereby generate the synthetic light LL presenting a large power density.

Then, the synthesized light LL is converted to a parallel light by relay lenses 34 and 35 and led to a collimator lens 36, whereby eclipse of the synthesized light LL is avoided.

The collimator lens 36 converges the incident synthesized light LL and leads the same to the optical connector 37, whereby the synthesized light LL is incident to an optical fiber connected to the optical connector 37. The synthesized light LL can be thus efficiently led to optical fibers 40A–40N of a short diameter (see FIG. 4) through the optical system composed of the relay lenses 34, 35 and collimator lens 36.

In the present embodiment, the magnification A of the anamorphic prisms 28A and 28B is selected to be 2.5 so as to re-form the shape of the light beams LA and LB from a flat ellipse to an ellipse close to a circle, thereby reducing the spot size of the synthesized light LL when it is incident to the optical fiber.

The present embodiment employs the laser diodes 22A and 22B, the stripe width of which is 200 $\mu m$ to synthesize the light beams LA and LB emitted from the laser diodes 22A and 22B. Also, the anamorphic prisms 28A and 28B provide a reduced size of the spot on the end surface of the optical fiber connected to the optical connector 37. More specifically, with the magnification A selected to be 2.5, as mentioned above, the spot size is reduced as given by the following equation:

$$200 \ \mu m/A = 200 \ \mu m/2.5 = 80 \ \mu m$$

Thus, the synthesized light LL having the spot size reduced to 80 $\mu m$ is supplied to the optical fiber, the diameter of which is 100 $\mu m$. It is therefore possible to provide a light density several times higher as compared with a case where the synthetic light LL is directly incident to an optical fiber with the diameter of 200 $\mu m$.

The optical fibers 40A–40N shown in FIG. 4 form a bundle so as to converge the synthesized lights LL emitted from the respective laser light sources 21A–21N and pump the laser rod 12 on the end surface thereof by the converged synthesized light. The laser rod 12 can be thus pumped on the end surface thereof by the synthesized light LL having a short spot diameter and an improved power density, whereby the laser light L0 correspondingly having a short spot diameter and a large light intensity is emitted.

In the present embodiment, the laser diodes 22A and 22B constitute first and second light sources for emitting the first and second light beams LA and LB respectively having a predetermined polarizing plane. The anamorphic prisms 28A and 28B in turn constitute first and second beam shape re-forming means for re-forming the shape of the first and second light beams LA and LB. Also, the relay lenses 34, 35 and the collimator lens 36 constitute an optical system for converging the synthesized light LL outputted from the polarizing beam splitter 32 and leading the converged synthesized light to the optical fiber.

According to the above described structure, the light beams LA and LB having the beam shapes re-formed and the polarizing planes perpendicular to each other are synthesized by the polarizing beam splitter 32 and then led to the optical fiber through a predetermined optical system, thereby making it possible to provide a laser light having a shorter spot diameter and an improved power density.

Figure 7:
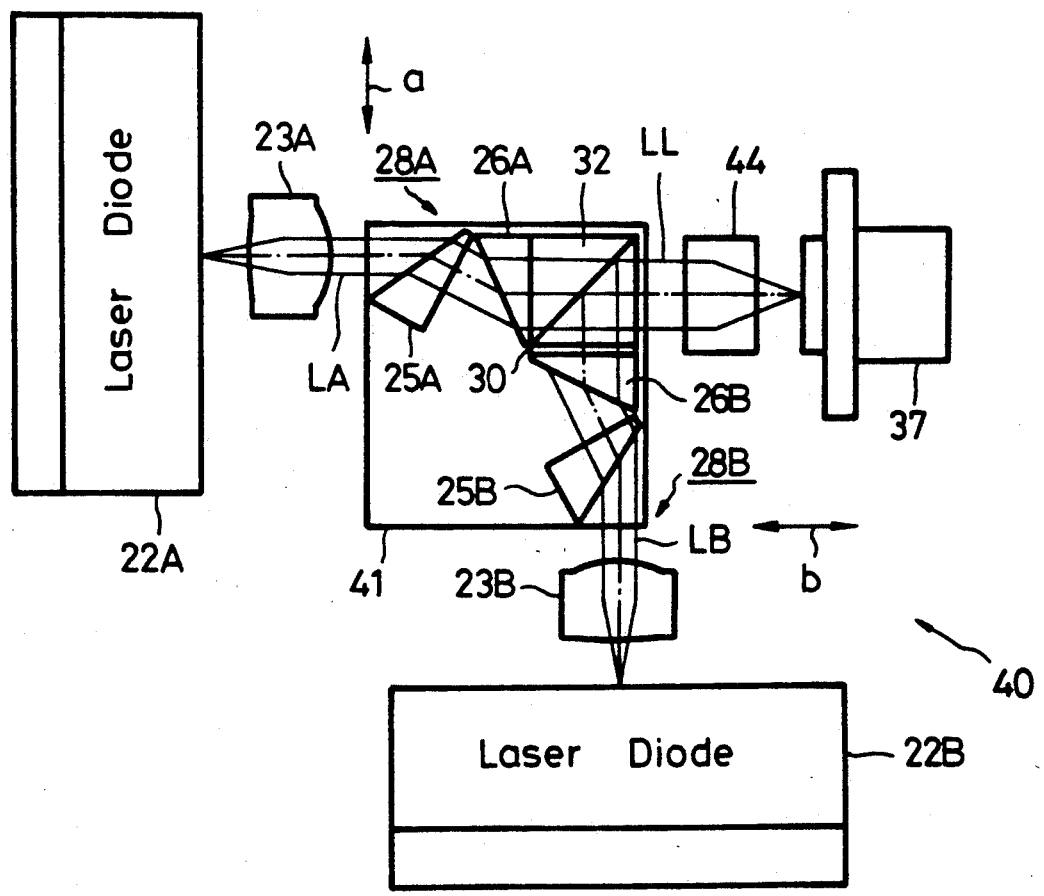
FIG. 7 is a block diagram illustrating a second embodiment of a laser light source of the present invention.

FIG. 7 illustrates a laser light source of a second embodiment of the present invention, where like parts corresponding to those of FIG. 5 are marked with the same reference numerals. A laser light source, generally indicated by 40 in FIG. 7, emits a synthesized light LL to an optical connector 37. A laser rod is pumped by the synthesized light LL to emit a laser light.

More specifically, the laser light source 40 has prisms 25A, 25B and 26A, 26B respectively constituting anamorphic prisms 28A, 28B, the half-wave plate 30 and the polarizing beam splitter 32 mounted on a glass substrate 41, whereby the overall size of the light source is reduced.

Further, the prism 26A, the polarizing beam splitter 32, the half-wave plate 30 and the prism 26B are integrated on their light incident and emitting faces, which are parallel to each other by abutting, contacting, etc., whereby the size of the glass substrate 41 is reduced and accordingly the overall size of the laser light source 40 is further reduced. If the prisms 26A, 26B, the half-wave plate 30 and the polarizing beam splitter 32 are thus integrally formed by bonding or the like, a coating process for preventing reflection can be removed on the contacting surfaces of the prisms 26A, 26B, the half-wave plate 30 and the polarizing beam splitter 32, thereby making it possible to provide the laser light source 40 of a correspondingly simple structure as a whole. Such reduction of the overall size of the laser light source 40 by mounting the prisms 25A, 25B and 26A, 26B, the half-wave plate 30 and the polarizing beam splitter 32 on the single glass substrate 41 also results in reducing the optical path from the laser diodes 22A, 22B to the optical connector 37.

It is therefore possible to effectively avoid extension of the light beams LA and LB, whereby the eclipse of the synthesized light LL can be effectively avoided even without the relay lenses 34 and 35 to converge the synthesized light LL on the optical connector 37. Accordingly, a correspondingly simpler and smaller-sized laser light source 40 can be provided.

In the present embodiment of FIG. 7, the relay lenses 34, 35 and collimator lens 36 are replaced with a converging lens 44 for coupling an optical fiber which converges the synthesized light LL on the optical connector 37, whereby a much simpler and smaller-sized laser light source 40 is provided.

The converging lens 44 for coupling an optical fiber constitutes an optical system for the light convergence, which converges the synthetic light LL outputted from the polarizing beam splitter 32 and leads the same to an optical fiber.

According to the structure shown in FIG. 7, the prisms 25A, 25B, 26A and 26B, the half-wave plate 30 and the polarizing beam splitter 32 are mounted on the single glass substrate 41 and the opposing surfaces thereof are brought into contact by a bonding-process, whereby a much simpler and smaller-sized laser light source 40 can be provided in addition to the effects produced by the first embodiment.

While the second embodiment shown in FIG. 7 has been discussed for the case that, after the light beams LA and LB, the polarizing planes of which are parallel to the surface of the sheet of drawing, are respectively emitted from the laser diodes 22A and 22B, the polarizing plane of the light beam LB is polarized by 90 degrees by the half-wave plate 30 through the anamorphic prisms 28A, 28B, the present invention is not limited to this specific embodiment. Alternatively, after the light beams LA and LB, the polarizing planes of which are vertical to the surface of the sheet of drawing, are respectively emitted from the laser diodes 22A and 22B, the polarizing plane of the light beam LA may be polarized by 90 degrees with respect to the polarizing plane of the light beam LB by the half-wave plate 30.

Also, instead of emitting from the laser diodes 22A and 22B the light beams LA and LB, the polarizing planes of which are coincident with each other, the laser diode 22B and the anamorphic prism 28B may be disposed with inclination of 90 degrees therebetween, whereby the half-wave plate 30 may be removed.

Figure 8:
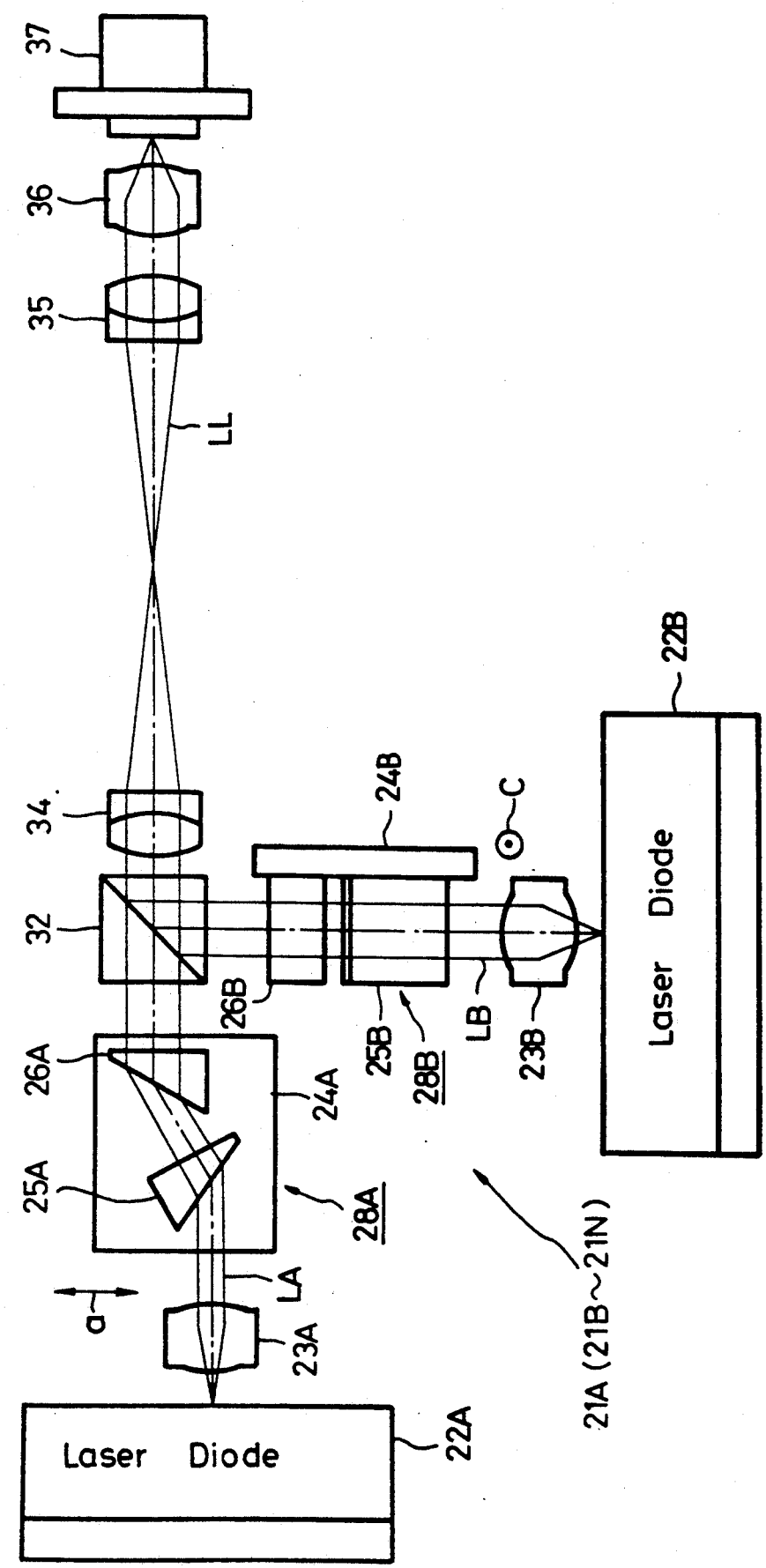
FIG. 8 is a block diagram illustrating an arrangement of a third embodiment of the laser light source according to the present invention.

FIG. 8 illustrates a third embodiment of the laser light source of the present invention, where like parts corresponding to those shown in FIG. 5 are marked with the same reference numerals. In the embodiment shown in FIG. 8, the half-wave plate 30 shown in FIG. 5 is removed, a laser diode 22B emits a laser beam in an elliptic shape which extends over approximately 10 degrees in the direction perpendicular to the surface of the sheet of drawing indicated by c and over approximately 30 degrees in the direction parallel to the same, and an anamorphic prism 28B is deviated by 90 degrees about the optical axis.

Figure 9:
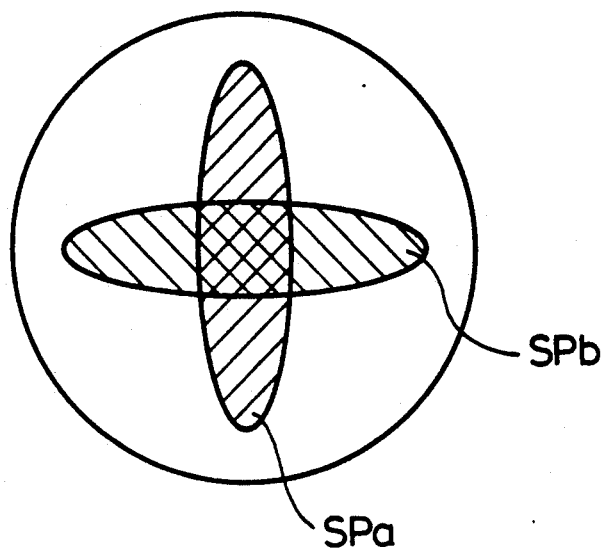
FIG. 9 is a diagram illustrating spots of light beams on an end face of an optical fiber used in the third embodiment of the present invention.

Therefore, similarly to the first embodiment shown in FIG. 5, the polarizing plane of a light beam LA (p-polarizing light) from the laser diode 22A is perpendicular to the polarizing plane of a light beam LB (p-polarizing light) from the laser diode 22B. The shapes of these light beams LA, LB are re-formed respectively by anamorphic prisms 28A, 28B in an ellipse close to a circle and then synthesized by a polarizing beam splitter 32. It will therefore be understood from FIG. 9 that elliptic beam spots SPa, SPb of the light beams LA, LB on an end surface of an optical fiber connected to an optical connector 37 have the major axes substantially perpendicular to each other. In the laser light source shown in FIG. 5, on the contrary, beam spots SPa, SPb of the light beams LA, LB on the end surface of the optical fiber connected to the optical connector 37 have the major axes oriented in the same direction as shown in FIG. 6. The rest of the structure shown in FIG. 8 is the same as the embodiment shown in FIG. 5.

The third embodiment shown in FIG. 8 is advantageous over the embodiment shown in FIG. 5 in that a speckle noise (modal noise) due to the optical fiber is reduced, and the half-wave plate is not needed to thereby further simplify the structure.

Next, the speckle noise (modal noise) will be discussed. The speckle noise (modal noise) $\sigma m^2$ is given by:

$$\sigma m^2 = \{Fc^2/(Fc^2 + 2Fs^2)\} \cdot \{(1-P)/P\}/Np$$

where Fc represents a fiber bandwidth, Fs a laser line width, P a coupling efficiency, and Np a number of pumping modes. It will be understood from the above equation that the third embodiment shown in FIG. 8 reduces the speckle noise (modal noise) since the number of pumping modes is increased, as compared with the embodiment shown in FIG. 5.

While the above embodiments have been discussed for the case that the synthesized light LL with the same wavelength is converged by the optical fibers, the present invention is not limited to this specific case. Alternatively, it is possible that, after a synthesized light may be generated from light beams with different wavelengths from each other by the aforementioned laser light source, it is converged, for example, by a dichroic mirror and led to an optical fiber.

Figure 10:
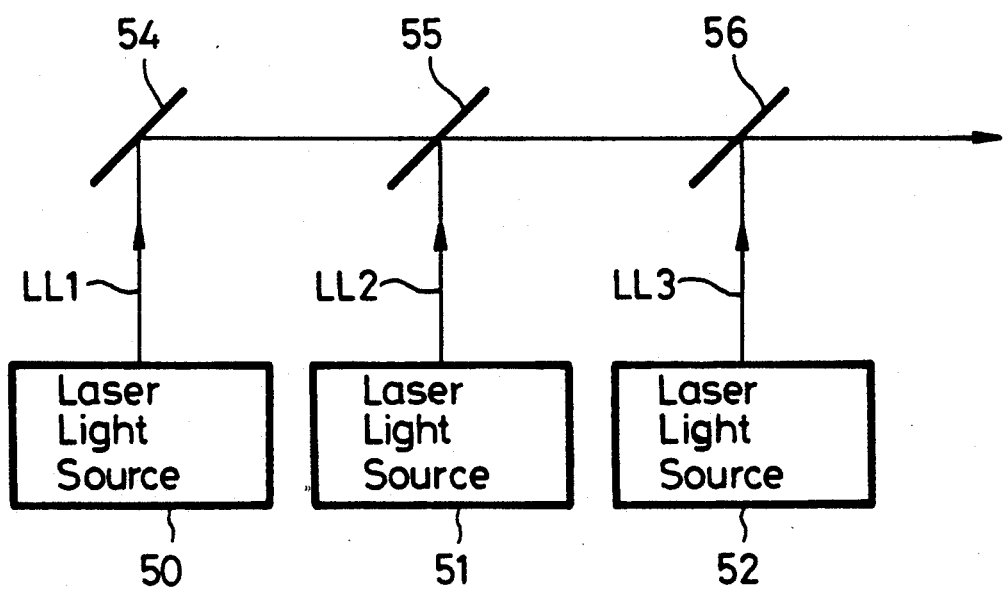
FIG. 10 is a diagram illustrating an arrangement of a fourth embodiment of the laser light source according to the present invention.

FIG. 10 illustrates a fourth embodiment of the present invention in which respective laser light sources 50, 51, 52 are constructed in the same manner as the laser light sources employed in the above-mentioned embodiments. More specifically, light beams emitted from a couple of laser diodes are synthesized by a polarizing beam splitter, and synthetic light LL1, LL2, LL3, respectively having wavelengths of 780 nm, 810 nm, 830 nm are generated.

The synthesized lights LL1, LL2, LL3 are further synthesized through a mirror 54 and dichroic mirrors 55, 56 such that the optical axes of the respective synthesized lights LL1, LL2, LL3 are coincident with one another.

With such a structure, it is possible to generate the synthesized lights LL1, LL2, LL3 having shorter beam diameters and larger light quantities as compared with the prior art as well as supply synthesized lights respectively having a different wavelength to a single optical fiber.

While the above embodiments have been described for the case that a predetermined laser rod is pumped to generate a laser light, the present invention is not limited to such specific embodiments and the synthesized laser light emitted from the laser light source can be widely applied to a laser printing, a laser soldering, a laser machining, a laser scalpel, or the like.

While several preferred embodiments of the present invention have been described in detail hereinabove, many modifications and variations thereof would be apparent to those skilled in the art without departing from the scope or spirit of the present invention, which is to be defined by the appended claims.

What is claimed is:

1. A laser light source comprising:
   a first light source for emitting a first light beam having a shape in cross-section of a flat ellipse;
   a second light source for emitting a second light beam having a shape in cross-section of a flat ellipse;
   first beam shape re-form means for re-forming the cross-sectional beam shape of the first light beam from a flat ellipse to a more circular ellipse;
   second beam shape re-form means for re-forming the cross-sectional beam shape of the second light beam from a flat ellipse to a more circular ellipse;
   polarizing means for polarizing the second light beam with respect to the first light beam such that the polarizing plane of a light beam emitted from said first beam shape re-form means is oriented at an angle of 90 degrees with respect to the polarizing plane of a light beam emitted from the second beam shape re-form means; and
   beam synthesizing means for synthesizing the light beam outputted from the first beam shape re-form means and a light beam outputted from the polarizing means, which is supplied thereto with an incident angle deviated by an angle of 90 degrees relative to the incident angle of the first light beam, to produce a synthesized light beam.

2. A laser light source according to claim 1, wherein the first and second beam shape reform means are anamorphic prisms.

3. A laser light source according to claim 1, wherein the beam synthesizing means is a polarizing beam splitter.

4. A laser light source according to claim 1, wherein the polarizing plane of the second light source for emitting the second light beam is the same as the polarizing plane of the first light source for emitting the first light beam.

5. A laser light source according to claim 1, wherein the polarizing means is a half-wave plate.

6. A laser light source according to claim 1 further comprising a beam converging optical system for converging the synthesized light beam outputted from the beam synthesizing means.

7. A laser light source according to claim 6, wherein the beam converging optical system comprises a relay lens.

8. A laser light source according to claim 6, further comprising an optical guide and wherein a light beam outputted from the beam converging optical system is supplied to the optical guide.

9. A laser light source according to claim 8, wherein the optical guide is an optical fiber.

10. A laser light source according to claim 9, wherein a plurality of such laser light sources individually supply separate light beams to a plurality of optical fibers which are bundled to form a single light source.

11. A laser light source according to claim 1, wherein the first and second beam shape reform means, the polarizing means and the beam synthesizing means are mounted on a single substrate.

12. A laser light source according to claim 11, wherein a beam emitting surface of the first beam shape reform means is formed integrally with a corresponding beam incident surface of the beam synthesizing means.

13. A laser light source according to claim 11, wherein a beam emitting surface of the beam polarizing means is formed integrally with a corresponding beam incident surface of the second beam shape reform means.

14. A laser light source according to claim 13, wherein a beam emitting surface of the second beam shape re-form means is formed integrally with a corresponding beam incident surface of the beam polarizing means.

15. A laser light source comprising:
   a first light source for emitting a first light beam having a cross-sectional shape of a flat ellipse;
   second light source for emitting a second light beam having a cross-sectional shape of a flat ellipse, the polarizing plane of which is different by an angle of 90 degrees relative to the polarizing plane of the first light beam;
   first beam shape re-forming means for reforming the cross-sectional beam shape of the first light beam to be a more circular ellipse;
   second beam shape re-forming means for re-forming the cross-sectional beam shape of the second light beam to be a more circular ellipse; and
   beam synthesizing means for synthesizing a light beam outputted from the first beam shape re-forming means and a light beam supplied from the second beam shape re-forming means with an incident angle different by 90 degrees relative to that of the first light beam to produce a synthesized light beam.

16. A laser light source according to claim 15, wherein the first and second beam shape re-forming means are anamorphic prisms.

17. A laser light source according to claim 15, further comprising a beam converging optical system for converging the synthesized light beam outputted from the beam synthesizing means.

18. A laser light source according to claim 17, wherein the beam converging optical system comprises a relay lens.

19. A laser light source according to claim 17, wherein the light beam outputted from the beam converging optical system is supplied to an optical guide.

20. A laser light source according to claim 19, wherein the optical guide is an optical fiber.

21. A laser light source according to claim 20, wherein a plurality of the optical fibers are bundled to form a single light source.

22. A laser light source according to claim 15, wherein the first and second beam shape re-forming means and the beam synthesizing means are mounted on an identical substrate.

23. A laser light source according to claim 22, wherein a beam emitting surface of the first beam shape reforming means is formed integrally with a corresponding beam incident surface of the beam synthesizing means.

24. A laser light source according to claim 22, wherein a beam emitting surface of the second beam shape reforming means is formed integrally with a corresponding beam incident surface of the beam synthesizing means.

25. A solid-state laser device comprising:
a first light source for emitting a first light beam;
a second light source for emitting a second light beam;
a first beam shape reforming means for reforming the cross-sectional beam shape of the first light beam to have a more circular cross-section;
a second beam shape reforming means for reforming the beam shape of the second light beam to have a more circular cross-section;
polarizing means for polarizing a light beam outputted from the second beam shape reforming means such that the polarizing plane of the light beam emitted from the second beam shape reforming means is oriented at an angle of 90 degrees relative to the polarizing plane of a light beam emitted from the first beam shape reforming means;
beam synthesizing means for synthesizing a light beam outputted from the first beam shape re-forming means and a light beam outputted from the polarizing means, which is supplied thereto with an incident angle different by an angle of 90 degrees relative to the incident angle of the first light beam, to produce a synthesized light beam; and
at least one optical fiber which is supplied with the synthesized light beam outputted from the beam synthesizing means;
wherein a light beam outputted from the at least one optical fiber is supplied to a laser medium to generate a laser light.

26. A solid-state laser device comprising:
a light source, including:
a first light source for emitting a first light beam;
a second light source for emitting a second light beam, the polarizing plane of which is different by an angle of 90 degrees relative to the polarizing plane of the first light beam;
first beam shape re-forming means for reforming the cross-sectional beam shape of the first light beam to have a more circular cross-section;
second beam shape re-forming means for reforming the cross-sectional beam shape of the second light beam to have a more circular cross-section;
beam synthesizing means for synthesizing a light beam outputted from the first beam shape re-forming means with a light beam output from the second beam shape re-forming means which is supplied with an incident angle different by an angle of 90 degrees relative to the incident angle of the first light beam; and
at least one optical fiber which is supplied with a light beam outputted from the beam synthesizing means,
a laser medium; and
wherein a light beam outputted from the at least one optical fiber is supplied to the laser medium to generate a laser light.

27. A solid-state laser device according to claim 25, wherein a plurality of such laser light sources individually supply separate light beams to a plurality of optical fibers which are bundled to form a single light source which supplies a light beam to the laser medium to generate the laser light.

28. A solid-state laser device according to claim 26, wherein a plurality of such laser light sources individually supply separate light beams to a plurality of optical fibers which are bundled to form a single light source which supplies a light beam to the laser medium to generate the laser light.

29. A laser light source according to claim 2 wherein the anamorphic prisms have a magnification factor of approximately 2.5.

30. A solid-state laser device according to claim 25 wherein the re-forming means comprise anamorphic prisms each having a magnification factor of approximately 2.5.

31. A solid-state laser device according to claim 26 wherein the re-forming means comprise anamorphic prisms each having a magnification factor of approximately 2.5.

* * * * *